United States Patent [19]

Lungo

[11] 3,918,013

[45] Nov. 4, 1975

[54] FILTER DEVICE

[76] Inventor: Antonio Lungo, 7076 Big Creek Parkway, Middleburg Heights, Ohio 44130

[22] Filed: Apr. 8, 1974

[21] Appl. No.: 458,712

[52] U.S. Cl. .................... 333/72; 310/9.1; 310/9.4; 310/9.5; 310/9.7

[51] Int. Cl.².. H03H 9/04; H03H 9/06; H03H 9/16; H01L 41/04

[58] Field of Search ......... 333/72; 310/9.1, 9.2, 9.4, 310/9.5, 9.7, 9.6, 9.8

[56] References Cited

UNITED STATES PATENTS

| | | | |
|---|---|---|---|
| 2,635,199 | 4/1953 | Wolfskill | 310/9.7 |
| 3,423,700 | 1/1969 | Curran et al. | 333/72 |
| 3,684,905 | 8/1972 | Martyn | 310/8.2 |
| 3,721,841 | 3/1973 | Wilson | 310/9.4 |

*Primary Examiner*—James W. Lawrence
*Assistant Examiner*—Marvin Nussbaum
*Attorney, Agent, or Firm*—Teare, Teare & Sammon

[57] ABSTRACT

A filter device including a slotted-plate piezoelectric ceramic resonator and a mounting assembly therefor. The resonator has a polygonal configuration including an electroded region at one end for electrical connection in the mounting assembly. Spaced mounting regions are located in the electroded region, and the resonator has a non-uniform width in the electroded region being at a maximum adjacent the mounting regions. The mounting assembly includes a base having a set of terminal leads mounted thereon. An electrically conductive support means is supported by the base for supportingly engaging the resonator adjacent the electroded region and for electrically connecting the resonator to the terminal leads. The support means engages the resonator over an area which extends beyond the nodal points of the resonator to provide maximum support for the body and confine the compliance thereof by limiting the shifting movement of the nodal points over the operating frequency range of the device.

27 Claims, 13 Drawing Figures

FILTER DEVICE

BACKGROUND OF THE INVENTION

The present invention relates to a filter device which utilizes a slotted-plate piezoelectric ceramic resonator, and more particularly, to an improved resonator and mounting assembly therefor.

As presently known, slotted-plate ceramic resonators are generally circular in configuration and have a uniform width in the electroded area, or area of mounting. The mounting assembly for such resonators is considered part of the filter device because of its mechanical loading on the resonator. Normally, in such prior constructions, the resonator is mounted at its nodal points so that the effect of the mounting assembly on the resonator is substantially negligible. In such resonators, the nodal points will shift position as the resonant frequency is tuned to higher frequencies. Therefore, it is most desirable to minimize this shifting of the nodal points while still providing adequate support for the resonator. In addition, the circular configuration of the former devices has created unnecessary problems in handling, and particularly with respect to orientation of the resonator during assembly operations.

In such prior arrangements, problems arise with respect to providing adequate support in order to prevent the resonator from striking the inner walls of its packaging when subjected to forces generated under vibration and shock. It has been found that, to extend the mounting of the slotted-plate resonator beyond the nodal area or points, provides a more adequate support to prevent such occurrences. In such a situation, the mounting assembly presents a mechanical loading on the resonator. It is important that the effects of such mechanical loading must be negligible on the resonators' electrical performance as a function of temperature, and must not adversely affect the selectivity of the filter assembly as indicated by its selectivity or skirt ratio, such being the band width at the 20 db level to the band width at the 3db level. In addition, such mounting must provide isolation from any external microphonic or acoustic noises.

SUMMARY OF THE INVENTION

The present invention contemplates providing an improved filter device, and more particularly, an improved piezoelectric ceramic resonator design and a mounting assembly therefor. In the present invention, the resonator is of the slotted-plate type having a unitary, thin body which includes an opening and a slot extending from the opening to the periphery of the body. An electroded region is provided on the end of the body remote from the slot between the opening and the periphery of the body for electrical contact in a filter device. The body includes spaced mounting regions in the electroded region for mounting the resonator in the filter device. Further, the body has a non-uniform width in the electroded region being at a maximum adjacent the mounting region for maximizing the support area and for confining the compliance of the device by limiting the shifting movement of the nodal points as the resonant frequency is tuned to higher frequencies. In the form shown, the resonator is of a symmetrical construction wherein the opening and slot define a pair of symmetrical sections. Each of the mounting regions are located in a respective one of the symmetrical sections and a nodal point is located in each of the symmetrical sections, with the mounting regions extending generally along lines which extend through the nodal points and the center of symmetry of the opening and through the nodal points. More specifically, the body is of a generally polygonal configuration, such as rectangular, square or the like, and includes at least one linear peripheral edge portion on the side of the body remote from the slit which extends generally symmetrically with respect to the opening, and more specifically, the junctures of the linear edge with the adjacent peripheral edges of the body are generally coincidental with the lines extending from the center of symmetry of the opening and through the nodal points of the resonator. The mounting assembly supportingly engages the resonator body adjacent the electroded region and includes a base having a set of terminal leads mounted thereon. An electrically conductive support means is supported by the base and engages the body adjacent the mounting regions for electrically connecting the body to the terminal leads. The support means engages the body in the mounting regions in an area which extends beyond the location of the nodal points. More specifically, the support means comprises a pair of circuit boards on opposite sides of the body and a pair of generally flat elastomeric support members of molded construction mounted on each of the circuit boards for engagement with the opposite sides of the body. Each of the support members includes a generally flat base portion having one side adhesively secured to an associated circuit board and a pair of raised, laterally-spaced pads disposed on the opposite side of the base portion for engaging the body. Each of the pads of elongated prismatic configuaration having a lengthwise apex edge which engages the body along the aforementioned mounting lines. Each support member includes a set of apertures having resilient conductor means in the form of helical springs having high damping characteristics which are biased between the body and the circuit boards to assure electrical contact therebetween. The springs are secured to the body, the circuit board and the interior walls of the aperture by elastomeric material to further assure maintenance of electrical contact. The connector element extends between and interconnects the circuit board so as to add rigidity to the structure and its final assembled condition.

The filter assembly of the present invention is of a simple yet rugged construction which is very effective to prevent the resonator from striking the inner walls of its packaging when subjected to forces generated under vibration and shock. More particularly, the non-uniform width of the electroded region of the resonator provides a comparatively larger mounting area than would be provided in the former circularly configured resonators of comparable size resulting in a more adequate support structure. Still further, the mounting means is of a construction and made of materials which effectively impose a mechanical loading on the resonator which is virtually negligible as a function of temperature and does not adversely affect the selectivity of a filter device. Still more particularly, the mounting assembly is structured so as to have high damping characteristics and provide isolation from any external microphonic or acoustic noises. In addition to being capable of operation over a wider frequency range than resonators of formerly known circular design of comparable size, the polygonal configuration of the resonator provides for operation at a lower frequency limit because of the additional weighting at its slotted end, and also facilitates in the handling and orientation of the resonator body during production assembly operations.

DESCRIPTION OF THE PREFERRED EMBODIMENTS

Figure 1:
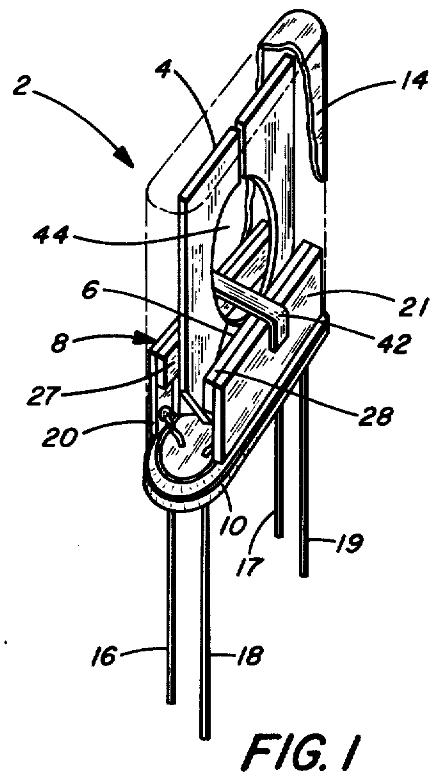
FIG. 1 is a perspective view of the filter assembly of the present invention.

Referring now to FIG. 1, the filter device of the present invention is illustrated, generally at 2, and is shown as including a slotted piezoelectric resonator element 4. The resonator element 4 has an electroded region 6 having a predetermined electrode configuration on its opposite sides. The resonator element is supported by resilient mounting assembly 8 which is arranged to minimize the mechanical restraint or loading on the resonator 4 during operation of the device.

Figure 2:
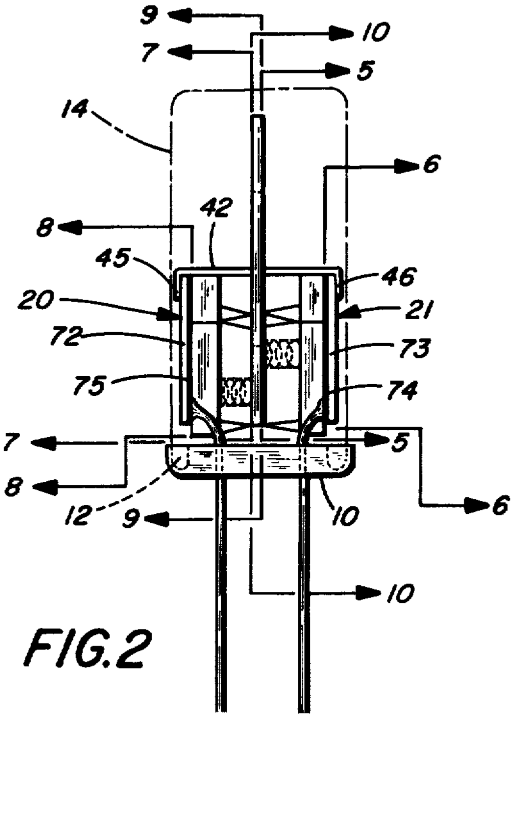
FIG. 2 is an end elevation view of the filter assembly shown in FIG. 1.

As shown in FIGS. 1 and 2, the mounting assembly 8 comprises a base or header 10 which is made of an insulating material, such as glass or the like, and which includes a moat 12 for slidably receiving therein the lower edge of a can or cover, as indicated at 14. Terminal wires 16, 17, 18 and 19 extend through the base 10 and are connected at their upper ends, such as by soldering or the like, to spaced, oppositely disposed printed circuit boards 20 and 21, such as at points 23, 24, 25 and 26 (best shown in FIGS. 6 and 8).

Figure 4:
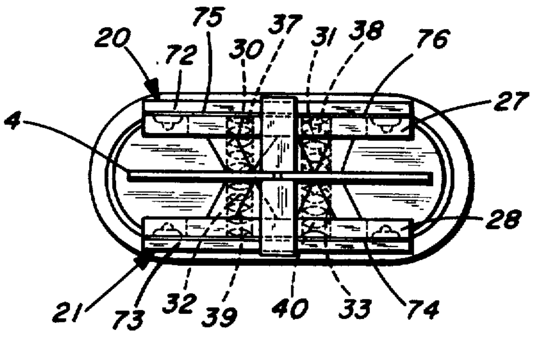
FIG. 4 is a top plan view of the filter assembly shown in FIG. 1 as seen from the top of FIG. 3.

Resilient mounting members 27 and 28 are attached, such as by suitable adhesive, to the interior sides of the circuit boards 20 and 21, respectively, for resiliently engaging the opposite sides of the resonator element 4 so as to prevent displacement of the latter when the device 2 is subjected to mechanical shock and vibration. As shown in FIGS. 2 and 4, the mounting members 27 and 28 are each provided with a pair of apertures 30, 31, 32 and 33, for receiving contact springs 37, 38, 39 and 40 respectively, to provide electrical interconnection between the electroded areas of the resonator 4 and the circuit boards 20 and 21, and to also provide a small centering force for centering the resonator element 4 between the mounting members 27 and 28.

A channel-type strap 42 extends through an opening 44 in the resonator 4 and has its opposite ends bent downwardly so as to form legs 45 and 46 for overlapping the upper edges of the circuit boards 20 and 21 for supporting the circuit boards in their upright opposed position with respect to one another. The can or cover 14 is sized so that its inside surface will slide over and simultaneously contact the legs 45 and 46 to provide further structural support for the device 2 when in the installed position.

Figure 3:
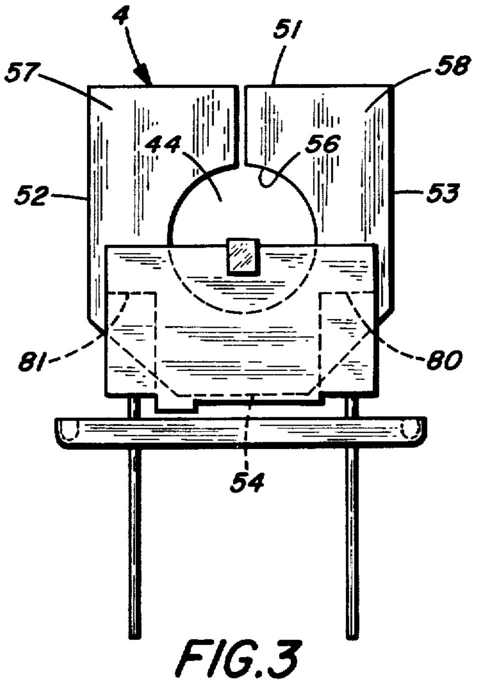
FIG. 3 is a side elevation view of the filter assembly shown in FIG. 1 as seen from the right side of FIG. 2.
Figure 9:
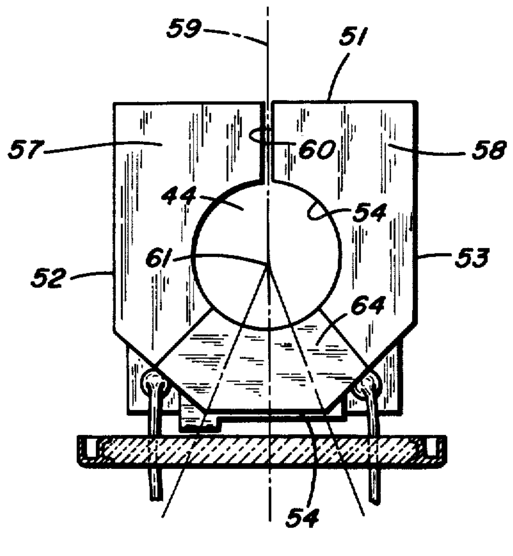
FIG. 9 is a transverse sectional view taken along the line 9—9 of FIG. 2.
Figure 11:
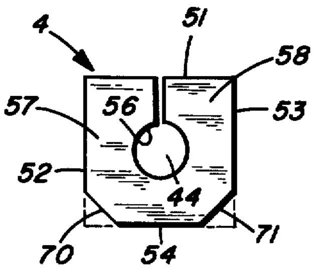
FIG. 11 shows one configuration for the resonator of the present invention.

The resonator 4 is preferably fabricated from a piezoelectric ceramic composition which may comprise lead zirconate-lead titanate as disclosed in U.S. Pat. No. 3,006,857 and No. 3,179,594 but, of course, it will be apparent to those skilled in the art that other compositions can be utilized which can be considered equal to those compositions referred to in the above mentioned patents. As shown in FIGS. 3 and 11, the resonator element 4 is formed from a flat material into a generally polygonal-shaped body, being very thin dimensionally as compared to its length or width, such as a ratio of 20 to 1 depending on which is smallest. More particularly, the resonator element 4 may initially be formed so as to have a square configuration, such as is best shown in FIG. 11, being defined by a top edge 51, side edges 52, 53 and lower edge 54. Referring now also to FIG. 9, the opening 44 in the resonator element is defined by an interior marginal edge 56 being configured such that the resonator element 4 is divided into two symmetrically-shaped halves or arms 57 and 58 by an imaginary line 59 which extends through the center 61 of the opening 44. For example, in the embodiment shown in FIGS. 9, the line 59 extends generally perpendicularly to the top edge 51 and the lower edge 54 and generally parallel to the side edges 52 and 53. Further, the opening 44 has a generally circular enlarged portion having its center coincident with the lines 59. A linear slot 60 of reduced width extends along the line 59 from the marginal edge 56 to the top edge 51. With this design, the resonator element 4 will have vibratory motion similar to a tuning fork which is within the plane of the resonator element 4, and which is symmetrical about the line 59 which bisects the slot 60 and passes through the center 61 of the opening 44.

Figure 10:
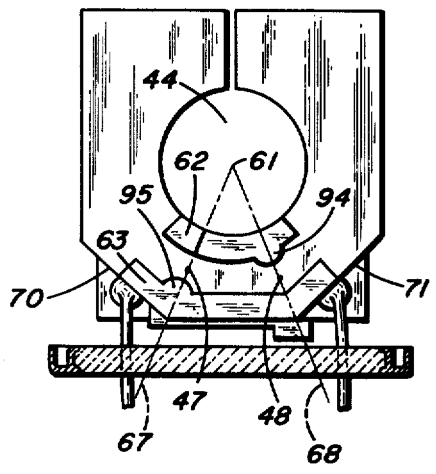
FIG. 10 is a transverse sectional view taken along the line 10—10 of FIG. 2.

As further shown in FIGS. 9 and 10, the electroded region 6 comprises a pair of electrode stripes on one face, including an upper electrode stripe 62 and a lower electrode stripe 63 (FIG. 10) and a single electrode stripe 64 on the opposite face (FIG. 9) to form a three-terminal network. The resonator element 4 is excited by applying a signal to one stripe, such as 62, on the one side of the resonator body 50 and the single electrode stripe 64 on the opposite side of the resonator body. As shown, the single electrode 64 is common to both the input and output circuits, and the output signal would be taken from the other electrode stripe, such as 63. Of course, a four-terminal network would be possible by providing two spaced electrode stripes on each face of the resonator element 4, and its operation would be similar to that of the three-terminal network.

During excitation of the resonator element 4 of the present invention, two nodal points 47 and 48 occur in the electroded region between the two electrode stripes 62 and 63, with the position of one nodal point 47 being to the left and the position of the other nodal point 48 being to the right of the line 59. Predictability of the exact position of these nodal points is difficult. However, the position of each can be determined experimentally by monitoring the electrical impedance as the support position is changed and by noting the location on the resonator element 4 where the electrical impedance at resonance is a minimum. In the present invention, the resonator element 4 has a width in the electroded region 6 which is not uniform and is a maximum along mounting lines, such as 67 and 68, each of which extends through one of the nodal points and the center 61 of the opening 44. The effect of the non-uniform width in the electroded region 6 is to distribute the compliance in a desired manner. This is accomplished by cutting off or otherwise having material removed from the resonator element 4 aat the corners defined by the side edges 52 and 53 and the lower edge 54. More particularly, such material is removed symmetrically with respect to the center 61 of the opening 44 so as to form angular corner edges 70 and 71 which diverge upwardly at the same angle from the lower edge 54 and which are shown as being generally coincidental with the juncture of the respective lines 67 and 68 with the lower edge 54. This construction has two basic purposes. First, it stabilizes the location of the nodal points 47 and 48, and second, it provides more support for the resonator element 4 when the mounting members 27 and 28 are applied to the opposite sides of the resonator element along the mounting lines 67 and 68 as will be described more fully hereinafter.

With regard to the aforementioned first purpose, the conventional slotted resonator having uniform width in the electrode region, for example a resonator having a circular outer configuration and a substantially concentric circular opening therein, will have a uniform distribution of compliance in the electrode region which will cause the nodal points to shift position as the resonant frequency is tuned to higher frequencies. The foregoing results from the fact that the resonator element 4 has two modes of vibration. One vibrational mode is similar to a tuning fork and the other is similar to a flexure bar, as the location of the nodal points for each of these vibrational modes is different, the resonator element 4 will vibrate between each of these vibrational modes as it is tuned, causing a corresponding shift in position of the nodal points depending upon the particular mode of operation of the resonator at a particular frequency. By removing the material so as to make the width of the resonator body in the electroded area a maximum along the mounting lines 67 and 68, the shifting of the nodal points is substantially restricted, as the resonator element 4 is tuned. In addition to the foregoing condition, another condition is established by which the width of the resonator element 4 is narrowest in the electroded region 6 along a line, such as the line 59, which extends through the center 61 of the opening 44 and bisects the electroded region 6, and more specifically, bisects the angle formed by the mounting lines 67 and 68 (FIG. 9). This latter condition reduces the stiffness in the area between the nodal points along the line 59 so as to provide this area of the resonator element 4 with the highest degree of compliance. Thus, by controlling the stiffness of the resonator 4, in the electroded region 6, in this manner, the shifting of the nodal points is substantially restricted enabling one mounting design to be used for the entire operating frequency range of the device.

Figure 6:
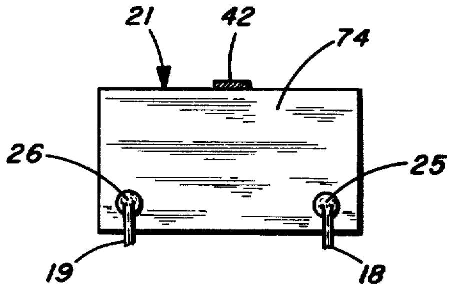
FIG. 6 is a transverse sectional view taken along the line 6—6 of FIG. 2.
Figure 8:
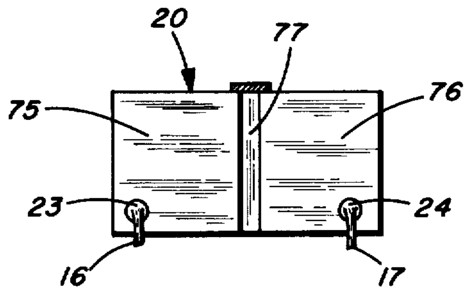

As shown in FIGS. 6 and 8, the circuit boards 20 and 21 are disposed on opposite sides of the resonator 4 to provide the support for the mounting pads 27 and 28 in addition to providing electrical conductivity between the terminal wires 16-19 and contact springs 37-40. The circuit boards 20 and 21 are shown as being generally rectangular in configuration with each including a base portion 72 and 73 (FIGS. 2 and 4) of nonconducting material, such as G-10 (Resin impregnated) Fiber Glass or the like. In the three-terminal device shown, the terminal board 21 has a conductive layer 74 secured to one side thereof, and the terminal board 20 has a pair of conductive layers 75 and 76 secured to its interior surface side. The conductive layer 74 covers the entire side of the circuit board 21, whereas, the conductive layers 75 and 76 cover the entire interior surface of the circuit board 20, except for a transversely extending space 77 for insulating the conductive area 75 from the conductive layer 76. The conductive layers 74, 75 and 76 may be made of any suitable conductive material, such as a copper alloy or the like, to assure good electrical connection, such as by soldering or the like, to the terminal wires 16-19. As shown, the terminal wires 16 and 17 are connected to the conductive layers 75 and 76, respectively, adjacent the lower corners of the circuit board 20, and the terminal wires 18 and 19 are connected to the lower corners of the circuit board 21. The terminal wires 16-19 project downwardly from the circuit boards 20 and 21 and extend through and are secured to the base 10 by having the material of the base 10 molded thereabout.

Figure 5:
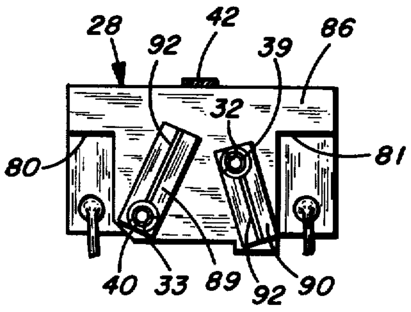
FIG. 5 is a transverse sectional view taken along the line 5—5 of FIG. 2.
Figure 7:
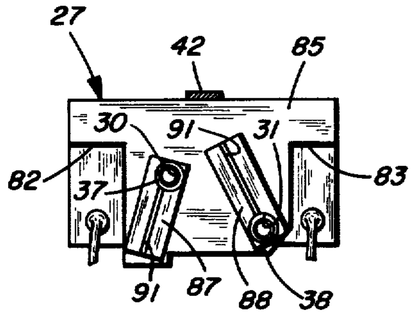
FIG. 7 is a transverse sectional view taken along the line 7—7 of FIG. 2.

As shown in FIGS. 3, 5 and 7, the mounting members 27 and 28 conform generally to the shape of the circuit boards 20 and 21, and are formed with cut-outs 80, 81, 82 and 83 at their lower corners to provide clearance for connection of the terminal wires to the circuit boards 20 and 21. Each of the mounting members 27 and 28 includes a base 85 and 86, respectively, which has one side secured such as by a suitable elastomeric adhesive, to its associated circuit board 20 and 21. Each of the mounting members 27 and 28 further include a pair of raised mounting pads 87, 88, 89 and 90, respectively, which are formed integral therewith and project outwardly toward the resonator 4 for supporting the resonator element 4 in the final assembly. As shown, the mounting pads 87 and 88 are of an elongated, generally prismatic-shape, having a lengthwise extending apex edge 91. Similarly, the mounting pads 89 and 90 have elongated apex edges 92. In the form shown, the pads 87 and 88 are oriented in inverse relation to the mounting pads 89 and 90 such that the mounting member 27 resembles a mirror image of the mounting pad 28. Further, the apex edges 91 of the mounting pads 89 and 90 are disposed in the same angular relationship and spaced the same distance apart from one another as the apex edges 92 of the mounting pads 89 and 90 so that in the final assembly the apex edges 91 will be aligned with and generally parallel to the apex edges 92 when disposed in engagement with the opposite sides of the resonator 4. In addition, the angular relationship between the two apex edges 91 and the two apex edges 92 is the same as that formed by the mounting lines 67 and 68 so that they will extend generally parallel to and engage the resonator 4 along the mounting lines 67 and 68 providing a well defined, thin but wide line of contact with the resonator 4 between the opening 44 and the outer periphery of the resonator 4. Such an arrangement avoids the clamp ing of the large area of the resonator 4 so as to avoid problems which result from temperature variations. More particularly, such an arrangement avoids greater shifts in the electrical parameter values than those normally attributable to the resonator as a function of temperature variation. Therefore, this arrangement minimizes the area of contact with the resonator 4 while meeting the basic support requirements necessary.

The mounting members 27 and 28 are of a molded construction and are preferably made of elastomeric material, such as SYLGARD 188 which is a trade designation of Dow Corning Corp., of Midland, Mich., which has stable elastic characteristics, as a function of temperature. During assembly, a very small force is applied by the mounting members 27 and 28 on the resonator 4. However, compressive set and cold flow characteristics of the material result, after a time, in a reduction of this force to practically zero. Further, during assembly, the apex edges 91 and 92 are coated with an elastic adhesive, such as diluted RTV 3144, which is a trade designation of Dow Corning Corp., of Midland, Mich., which has a low viscosity and provides a thin bond with the resonator element 4. With the compressional forces being almost negligible, the resonator element 4 is free to vibrate at its resonant frequency. However, with the resonator element 4 bonded as aforesaid to the mounting pads 91 and 92, it is restricted from extensive motion by forces of shock and vibration. Further, the mounting members 27 and 28 absorb the energy of the shock and vibration forces and keep the displacement of the resonator element 4 within safe limits from contact with the cover 14. By using molded support members 20 and 21, the mounting can be more closely controlled to minimize the effect of mounting vibrations on the electrical behavior of the resonator element 4.

Referring again to FIGS. 5 and 7, the apertures 30 and 32 are positioned at the top end of the mounting pads 87 and 90 while the apertures 31 and 33 are positioned at the bottom edge of the mounting pads 88 and 90 so that the springs 37 and 35 will be disposed in axial alignment with the springs 36 and 38, respectively, on the opposite sides of the resonator 4 in the final assembly. The springs 35-38 are preferably of a very light weight construction so as to be highly compliant to maintain contact between the circuit boards 20 and 21 and the resonator 4. When the springs 35-38 are disposed in the apertures 30-33, they are coated with the aforementioned elastic adhesive, such as diluted RTV-3144 or the like, so as to bond them to the mounting members 27 and 28 and the resonator 4. This is accomplished by putting two drops of the adhesive on each spring and allowing the adhesive to cure. This provides a mounting which has a high degree of decoupling to the resonator 4 while permitting the resonator 4 to vibrate fully with a minimum of damping and maximum mechanical support to resist forces of shock and vibration.

Referring now to FIG. 10, the electrode stripes 62 and 63 are formed with large contact areas 94 and 95 which are located along the mounting lines 68 and 67, respectively, for contact with two of the contact springs, such as 37 and 38.

Figure 12:
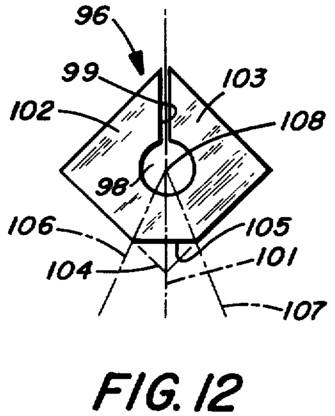
FIG. 12 shows another configuration for the resonator of the present invention.

In FIGS. 11 and 12, there is shown two other embodiments 96 and 97 of the resonator which have a different configuration than the resonator element 4 in FIG. 11. More specifically, the resonator 96 (FIG. 12) is shown as having a generally diamond-shaped mounting which includes an opening 98 therein. A slot 99 extends outwardly from the opening to one corner, as at 100, along a line 101, which divides the body into two symmetrical halves, or arms, 102 and 103. The corner 104 opposite corner 100 is cut off or otherwise removed to form the lower linear edge 105 which extends generally perpendicular to the line 101 and is generally symmetrical with respect to the center of the opening 98. In this arrangement, the nodal points of the resonator 96 will be located on opposite sides of the line 104, and the lower edge 105 will be cut so that imaginary lines 106 and 107, which extend through the center 108 of the opening 98 and through the opposite ends of the edge 105, will extend approximately through the location of the nodal points. Thus, the resonator 96 will have a maximum width in the electroded area (which has been deleted for purposes of description) along the imaginary or mounting lines 116 and 117.

Figure 13:
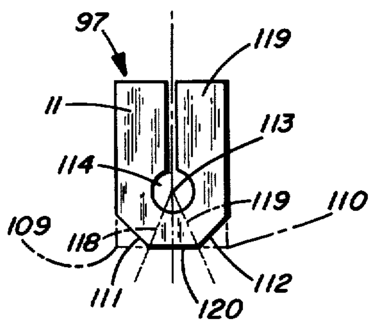
FIG. 13 shows still another configuration for the resonator of the present invention.

Referring now to FIG. 13, the resonator element 97 is essentially of the same design as the resonator element 4, with the exception that it has a generally rectangular configuration. As shown, the resonator 97 has its lower corners 109 and 110 cut off or otherwise remove to form angular side edges 111 and 112 which extend generally symmetrically with respect to the center 118 of the opening 114. Again, a line 115 divides the resonator element 97 into two symmetrical sections or arms 116 and 117, which, because of the rectangular shape of the resonator element 97, will be longer than the sections or arms 57 and 58 of the resonator 4. By making the sections 116 and 117 longer for a given width results in a lower resonant frequency. Thus, a greater frequency range is obtainable with the polygonal configuration shown thereon with the former circular configuration. Further, the angular side edges 111 and 112 are cut so that the resonator element 97 will have its maximum width in the electroded area along lines 118 and 119 which extend from the center 113 of the opening 114 through the nodal points of the resonator 97 and pass through the juncture of the angular side edges 111 and 112 and the lower linear edge 120 thereof.

It should be pointed out that the resonant frequency of the resonator elements 4, 96 and 97 can also be varied by varying the diameter of the openings 44, 98 and 114 or by shifting the position of these openings toward the lower edges 54, 105 and 120. Further, these lower edges 54, 101 and 120 could be curved on a radius, but best results have been achieved with the linear construction.

I claim:

1. A piezoelectric ceramic resonator of the slotted-plate type for use in a filter assembly comprising,
- a unitary, generally flat, symmetrically-shaped body made of piezoelectric ceramic material and defined by an outer peripheral edge,
- said body includes an opening having one portion disposed inwardly of said peripheral edge and a slot portion which extends to said peripheral edge defining a pair of laterally extending arms,
- said arms are integrally connected to one another at one of their ends by a connecting portion of said body and are spaced apart from one another at their opposite ends to enable vibration thereof,
- said body includes spaced mounting regions disposed adjacent said connected ends of said arms and being separated by said connecting portion for mounting said resonator in a filter assembly, electrode means on said body adjacent said mounting regions for electrical contact of said resonator in a filter assembly, and said body is of one transverse width dimension across said mounting regions and of a reduced transverse width across said connecting portion as measured in a transverse direction between said one portion of said opening and said outer peripheral edge of said body whereby the compliance of said resonator is confined by limiting the shift of its nodal points as the resonator frequency is tuned to different frequencies.

2. A resonator in accordance with claim 1, wherein each of said mounting regions is located in a respective one of said arms.

3. A resonator in accordance with claim 1, wherein said body includes a nodal point located in each of said arms, and each of said mounting regions has a maximum width in a direction extending generally along an imaginary line which extends through a respective one of said nodal points and the center of symmetry of said one portion of said opening.

4. A resonator in accordance with claim 2, wherein said connecting portion of said body is defined in part by at least one linear peripheral edge portion which extends generally symmetrically with respect to the center of symmetry of said one portion of said opening.

5. A resonator in accordance with claim 4, wherein said body is generally polygonal in configuration with said connecting portion being further defined by a pair of corner edge portions which extend angularly outwardly from the opposite ends of said one linear peripheral edge portion defining a pair of junctures, and said corner edge portions extend angularly outwardly away from one another in a direction toward said opposite end of said arms being disposed generally symmetrically with respect to the center of symmetry of said one portion of said opening.

6. A resonator in accordance with claim 1, wherein said connecting portion has a minimum width along an imaginary line which extends between said mounting regions and bisects said body.

7. A resonator in accordance with claim 5, wherein said slot extends to one corner of said body, said one linear peripheral edge extends generally symmetrically with respect to the center of symmetry of said one portion of said opening and said one corner.

8. A resonator in accordance with claim 7, wherein said one portion of said opening is generally circular in configuration having a diameter greater than the maximum transverse width of said slot as measured in the transverse direction between said arms.

said slot extends radially outwardly from said one portion, and each of said mounting regions has a maximum width in a direction extending generally along an imaginary line which extends through a respective one of said nodal points and the geometrical center of said one portion.

9. A resonator in accordance with claim 7, wherein said body is generally square in configuration.

10. A resonator in accordance with claim 1, wherein said electroded means comprises an electrically conductive material on said body, said opening is defined by an interior marginal edge, and said conductive material is disposed over spaced areas on at least one side of said body having one area extending laterally along a segmental portion of said interior marginal edge adjacent said one portion of said opening, and another area extending laterally along an adjacent segmental portion of said outer peripheral edge of said body.

11. A resonator in accordance with claim 10, wherein said conductive material is disposed on the opposite side of said body over an area extending between said segmental portion of said interior marginal edge adjacent said one portion of said opening and said segmental portion of said outer peripheral edge of said body.

12. A filter assembly comprising, in combination a resonator, said resonator comprising a unitary, generally flat, symmetrically-shaped body defined by an outer peripheral edge, said body includes an opening having one portion disposed inwardly of said peripheral edge and a slot portion which extends to said peripheral edge defining a pair of laterally-extending arms, said arms are integrally connected to one another at one of their ends by a connecting portion of said body and are spaced apart from one another at their opposite ends to enable vibration thereof, said body includes spaced mounting regions disposed adjacent said connected ends of said arms and being separated by said connecting portion for mounting said resonator in a filter assembly, electrode means on said body adjacent said mounting regions for electrical contact of said resonator in a filter assembly, a mounting assembly for supportingly engaging said body adjacent said mounting regions in contact with said electrode means, said mounting assembly including a base having a set of terminal leads mounted thereon, an electrically conductive support means supported by said base and engaging said body adjacent said mounting regions and in contact with said electrode means for electrically connecting said body to said terminal leads, and said body being of one transverse width adjacent said mounting regions and a reduced width adjacent said connecting portion as measured in a transverse direction between said opening and said outer peripheral edge of said body whereby the compliance of said resonator is confined by limiting the shift of its nodal points as the resonator frequency is tuned to different frequencies.

13. An assembly in accordance with claim 12, wherein said support means engages said body in said mounting region over an area which extends beyond the location of its nodal points whereby the support of said body is maximized.

14. An assembly in accordance with claim 12, wherein said body includes a nodal point located in each of said arms, each of said mounting regions has a maximum width in a direction extending generally along an imaginary line which extends through a respective one of said nodal points and the center of symmetry of said one portion of said opening.

15. An assembly in accordance with claim 12, wherein said support means comprises a pair of circuit boards disposed on opposite sides of said body, and a pair of generally flat elastomeric mounting members mounted on each of said circuit boards for engagement with the opposite sides of said body.

16. An assembly in accordance with claim 15, wherein each of said mounting members includes a generally flat base portion having one side adhesively secured to an associated circuit board, and a pair of raised laterally-spaced pads disposed on the opposite side of said base portion for engaging said body.

17. An assembly in accordance with claim 16, wherein each of said pads is of an elongated, prismatic configuration having a lengthwise extending apex edge, and said apex edges of said pads extend in angular relation with one another being disposed in engagement with said body along said mounting lines.

18. An assembly in accordance with claim 15, wherein each of said mounting members includes a set of apertures therethrough, and resilient conductor means disposed in said apertures for electrically connecting said body to said terminal leads.

19. An assembly in accordance with claim 18, wherein said resilient conductor means comprise helical springs having highly compliant characteristics, and said springs are secured to said body, the circuit board and the interior walls of said apertures by an elastomeric adhesive having low viscosity characteristics to provide a high degree of decoupling to the resonator 4 with a minimum of damping and mechanical support.

20. An assembly in accordance with claim 15, wherein said mounting members are made of a molded elastomeric construction to provide stable elastic properties as a function of temperature.

21. An assembly in accordance with claim 16, wherein said electroded means comprises electrically conductive strips on the sides of said body, said mounting members include a pair of apertures therein, one of said apertures is disposed adjacent one end of one of said pads and the other of said apertures pads, and helical springs are disposed in said apertures being biased between said body and said circuit board for electrically connecting said body with said terminal leads.

22. An assembly in accordance with claim 15, including a connector element extends between and interconnects said circuit boards with one another to add rigidity to said mounting assembly.

23. An assembly in accordance with claim 22, wherein said connector element comprises a clip which extends through said opening being bent adjacent its opposite ends for engaging the sides of said circuit boards opposite from said support members.

24. A filter assembly comprising, in combination a resonator having a unitary, generally flat, symmetrically-shaped body, said body includes spaced mounting regions disposed adjacent generally symmetrically located nodal points, electrode means on said body adjacent said mounting regions to provide an electrical contact for said resonator when in the mounted position in the filter assembly, a mounting assembly for supportingly engaging said body adjacent said mounting regions, said mounting assembly includes a base having a set of terminal leads mounted thereon, an electrically conductive support means supported by said base and engaging said body adjacent said mounting regions for electrically connecting said body to said terminal leads, said support means includes elastomeric mounting means engaging said body adjacent said mounting regions over an area which extends beyond the location of said nodal points of said body, a resilient conductor means supported by said mounting means for compressive contact with said electrode means by said mounting means, and said resilient conductor means being less subject to compressive set than said mounting means whereby said conductor means will have more uniform compressive force characteristics when subjected to compressive force over a period of time when in said filter assembly than said mounting means to assure electrical contact with said resonator.

25. An assembly in accordance with claim 24, wherein said electrically conductive support means includes a pair of circuit boards disposed on opposite sides of said body, and said resilient conductor means being supported in compression between said circuit boards and said resonator.

26. An assembly in accordance with claim 24, wherein said mounting members are made of a moulded elastomeric construction providing stable elastic properties as a function of temperature.

27. An assembly in accordance with claim 24, wherein said resilient conductor means comprises helical springs having highly compliant characteristics providing a high degree of decoupling to said resonator with a minimum of damping and mechanical support.

* * * * *

UNITED STATES PATENT OFFICE

CERTIFICATE OF CORRECTION

Patent No. 3,918,013 Dated November 4, 1975

Inventor(s) Antonio Lungo

It is certified that error appears in the above-identified patent and that said Letters Patent are hereby corrected as shown below:

Column 3, line 38, after "element" insert --4--.

After each of the following occurrences of the word "resonator" insert the word --element--:

Column 3, lines 41, 62 and 67
Column 4, line 9
Column 5, lines 60 and 66
Column 6, lines 41, 58, 61, 63, 65 and 66
Column 7, lines 45, 49, 54 (two occurrences) and 65
Column 8, lines 9, 14, 21 and 39.

Column 4, line 50, delete "body 50" and insert --element 4--.
line 52, delete "body" and insert --element 4--.

Column 5, line 51, after "4" insert --in the electroded region--.
lines 51 and 52, after "narrowest" delete "in the electroded region 6."

Column 7, line 63, after "resonator" insert --element of the invention--.
line 66, delete "mounting" and insert --body--.

Column 8, line 2, delete "body" and insert --resonator element 96-

UNITED STATES PATENT OFFICE

CERTIFICATE OF CORRECTION

Patent No. 3,918,013 Dated November 4, 1975

Inventor(s) Antonio Lungo

It is certified that error appears in the above-identified patent and that said Letters Patent are hereby corrected as shown below:

Column 12, line 35, delete "by said mounting means".
line 62, delete "with a minimum of" and insert --to minimize--.
line 62, after "and" insert --maximize--.

Signed and Sealed this

Twenty-first Day of June 1977

[SEAL]

*Attest:*

RUTH C. MASON
*Attesting Officer*

C. MARSHALL DANN
*Commissioner of Patents and Trademarks*